United States Patent [19]

McGowan

[11] Patent Number: 4,658,157
[45] Date of Patent: Apr. 14, 1987

[54] IGFET COMPARATOR CIRCUIT HAVING GREATER CONTROL OF INTENDED OFFSET VOLTAGE

[75] Inventor: Michael J. McGowan, New Brunswick, N.J.

[73] Assignee: RCA Corporation, Princeton, N.J.

[21] Appl. No.: 739,819

[22] Filed: May 31, 1985

[51] Int. Cl.[4] .................... H03K 5/24; H03F 3/16; H03F 3/45
[52] U.S. Cl. .................... 307/355; 307/491; 307/496; 330/253; 330/261
[58] Field of Search ............ 307/491, 496, 497, 355, 307/362; 330/253, 261

[56] References Cited

U.S. PATENT DOCUMENTS

| | | | |
|---|---|---|---|
| 4,050,030 | 9/1977 | Russell | 330/253 X |
| 4,480,231 | 10/1984 | Takehara | 330/261 |
| 4,484,148 | 11/1984 | Wieser et al. | 330/253 |
| 4,489,282 | 12/1984 | Jett, Jr. | 330/261 |
| 4,533,876 | 8/1985 | Haque et al. | 330/253 |
| 4,538,114 | 8/1985 | Kunimi et al. | 330/253 |
| 4,554,515 | 11/1985 | Burson et al. | 330/261 |

*Primary Examiner*—Larry N. Anagnos
*Attorney, Agent, or Firm*—Birgit E. Morris; Henry I. Schanzer; Stanley C. Corwin

[57] ABSTRACT

A voltage offset introduced in a differential amplifier stage by the addition of an offset current is rendered relatively constant by making the offset current a function of, and responsive to, the level of the differential input voltage applied to the differential amplifier stage.

5 Claims, 2 Drawing Figures

IGFET COMPARATOR CIRCUIT HAVING GREATER CONTROL OF INTENDED OFFSET VOLTAGE

This invention relates to means for generating an offset voltage and for maintaining the offset voltage relatively constant over a wide range of processing parameters and operating conditions.

Figure 1:
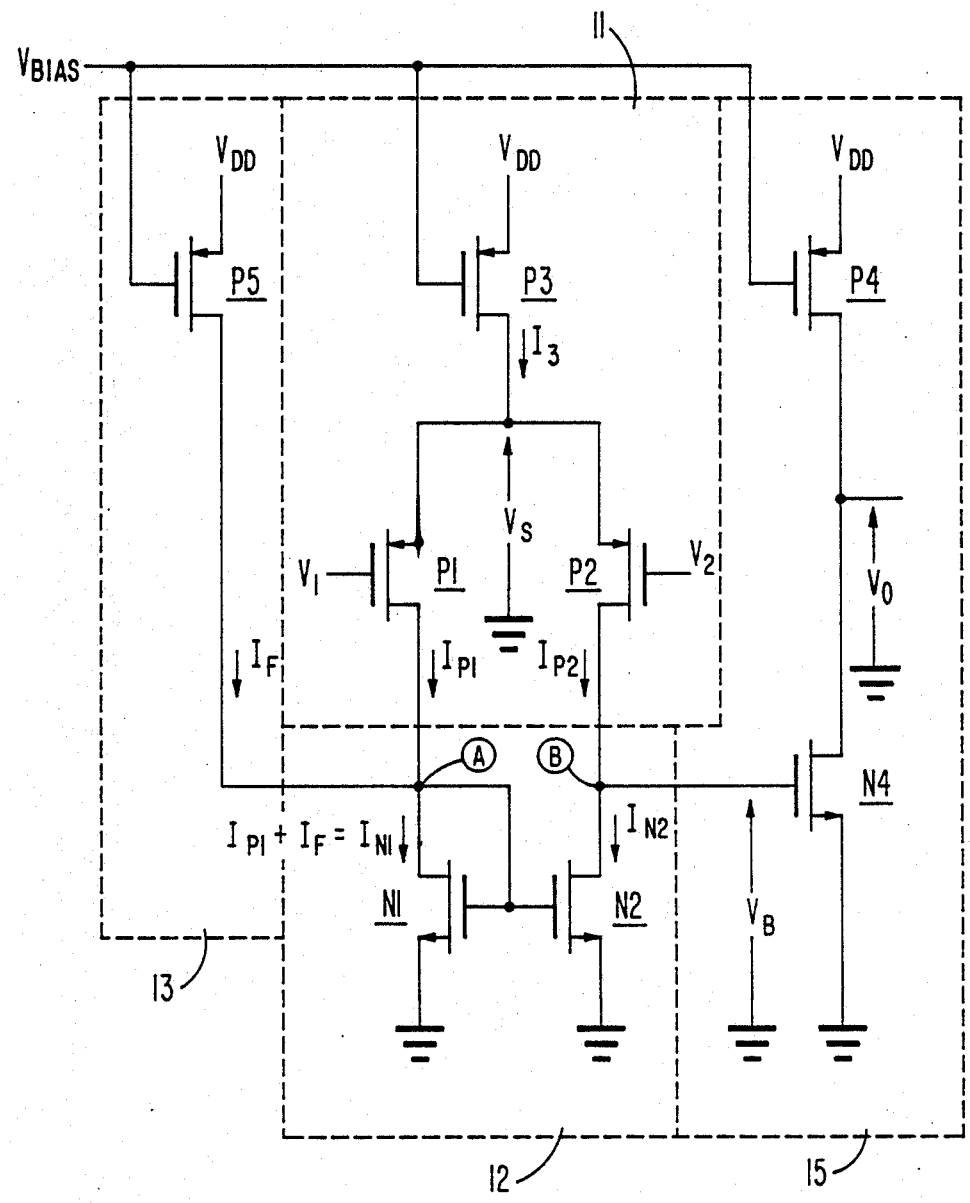

In many circuits and systems, it is desirable and/or necessary to generate an offset, or threshold level, which must be exceeded before a change is produced. A problem with known circuits is that the offset varies considerably over the desired operating range of the circuit. For example, FIG. 1 shows a prior art comparator circuit with offsetting means 13. The comparator circuit is comprised of a balanced differential amplifier input stage 11 having differential output nodes A and B across which is connected a current mirror stage 12. The offset means 13 includes a current generator which produces an offset current $I_F$ into node A. An inverter 15 is connected at its input to node B and produces an output voltage (Vo) at its output.

Typically, the differential stage 11 includes an IGFET P3 whose source and gate electrodes are connected to fixed points of potential, $V_{DD}$ and $V_{BIAS}$, respectively, whereby P3 is intended to function as a constant current generator. The differential stage 11 is designed such that the geometry of the insulated-gate field-effect transistor (IGFET) P1 is equal to that of IGFET P2. Similarly, in the current mirror stage, the geometry of IGFET N1 is equal to that of IGFET N2.

In the absence of stage 13 the operation of the circuit may be characterized as follows: (1) When the voltage, (V1) applied to the gate of P1 is equal to the voltage (V2) applied to the gate of P2 the current, $I_{P1}$, flowing through P1 is equal to the current $I_{P2}$ through P2. $I_{P1}$ flows into node A and the source-drain path of N1 resulting in a current $I_{N1}$. The current $I_{N1}$ through N1 is mirrored into N2 which then tends to draw a current ($I_{N2}$) of amplitude equal to $I_{N1}$ out of node B. For the condition where $I_{P1}$ and $I_{P2}$ are equal and $I_{P1}$ is equal to $I_{N1}$, the current $I_{P2}$ into node B is equal to the current $I_{N2}$ out of node B. The voltage ($V_B$) at node B is then, by definition, at its switching point ($V_{BSP}$) a value (in one example, the switching point was 1.3 volts, but the switching point may vary over a relatively large range) for which N4 is on the verge of conducting; (b) when V1 is greater than V2, $I_{P1}$ is less than $I_{P2}$, the current ($I_{P1}$) through N1 is mirrored in N2 which then draws a current having a value of $I_{P1}$ out of node B. Since $I_{P2}$ into node B is greater than $I_{P1}$ out of node B, the voltage ($V_B$) at node B rises above $V_{BSP}$, the conducting threshold voltage of N4, causing N4 to be turned on hard to draw (sink) more current than P4 can produce, whereby and the output voltage (Vo) of stage 15 to go low; (c) when V1 is less than V2, $I_{P1}$ is greater than $I_{P2}$, $I_{P1}$ is mirrored in N2 which then tends to draw a current equal to $I_{P1}$ out of node B. Since $I_{P2}$ into node B is less than the current ($I_{P1}$) being drawn out of node B, the voltage ($V_B$) at node B decreases sharply causing N4 to be turned off and all the current of P4 flows into the output node, whereby the voltage (Vo) rises towards $V_{DD}$ volts.

With offset generator 13 in the circuit, an offset current $I_F$ flows into node A in addition to the current $I_{P1}$. The offset stage includes an IGFET P5 connected at its source to $V_{DD}$, at its gate to a bias potential ($V_{BIAS}$) and at its drain to node A. The geometry of P5 is proportional to that of P3. Also, P5 is biased like P3 to generate an offset current $I_F$ flowing into node A is proportional to the current ($I_{P3}$) through P3. The offset current $I_F$ into node A causes the switching point of the differential stage to be other than when V1=V2. With the offset source 13 in the circuit, the total current ($I_{N1}$) into node A and into the source-drain path of N1 is $I_{P1}+I_F$. This current ($I_{P1}+I_F$) is mirrored in N2 which tends to draw a like current out of node B. The switching point (SP) at node B now occurs when $I_{P2}=I_{P1}+I_F$. To establish this current condition, V1 must be greater than V2 by an offset voltage ($\Delta V_F$) which causes the current $I_{P2}$ to be equal to $I_{P1}$ plus $I_F$. When this occurs, the current $I_{P2}$ into node B is equal to the current $I_{P1}+I_F$ into node A and out of node B. When V1 is less than $\Delta V_F$ volts above V2, $I_{P2}$ is less than $I_{P1}+I_F$, $V_B$ is driven below $V_{BSP}$, N4 is turned-off and Vo is driven high. When V1 is more than $\Delta V_F$ volts above V2, $I_{P2}$ is greater than $I_{P1}+I_F$, $V_B$ is driven above $V_{BSP}$, N4 is turned-on hard, and Vo is driven low.

A problem with the circuit of FIG. 1 is that the offset voltage ($\Delta V_F$) varies considerably over the operating range. This may be better understood by briefly examining the operation of the circuit for different common-mode input voltage values of V1 and V2.

Assume, for example, that: (a) the threshold voltage ($V_T$) of the IGFETs is 0.8 volts; (b) $V_{DD}$ is equal to 5 volts; (c) $V_{BIAS}$ is set at 4 volts such that approximately 150 microamperes flows through P3 and 75 microamperes flows through each one of P1 and P2 when V1=V2=2.5 volts; and (d) $I_F$ is set at 10.5 microamperes and will remain at that level, with $V_{DD}$ and $V_{BIAS}$ held constant, throughout the operating range.

When V1=V2=1 volt, $V_S$ is equal to 2 volts, and the $V_{DS}$ of P3 is equal to 3.0 volts. P3 is then operated in ($I_{DS}$) the current saturation region portion of its source-to-drain current ($I_{DS}$) versus source-to-drain ($V_{DS}$) electrical characteristic and supplies a current of approximately 171 microamperes. With $I_F$ equal to 10.5 microamperes, simulations indicate that V1 has to be increased by a voltage offset ($\Delta V_F$) of 72 millivolts to cause $I_{P2}$ to equal $I_{N2}$, and for node B to be set at its switching point ($V_{BSP}$).

When V1=V2=2.5 volts, $V_S$ is equal to 3.5 volts, and the $V_{DS}$ of P3 is now equal to 1.5 volts. P3 is operated closer to the knee of the $I_{DS}-V_{DS}$ electrical characteristics and the current passed through P3 is approximately 152 microamperes. With $I_F$ equal to 10.5 microamperes simulations indicate that a voltage offset of 76 millivolts is needed to set $I_{P2}=I_{N2}$ and $V_B$ at its switching point.

When V1=V2=3.5 volts, $V_S$ is equal to 4.5 volts, and the $V_{DS}$ of P3 is now equal to 0.5 volts. P3 is then operated in what is commonly called the "linear region" of its $I_{DS}-V_{DS}$ characteristics and its current is limited to approximately 50 microamperes. With $I_F$ equal to 10.5 microamperes, simulations indicate that an offset voltage of 164 millivolts is needed to cause $I_{P2}$ to equal $I_{N2}$ and $V_B$ to be set at its switching point ($V_{BSP}$).

It is evident from the above that P3 whose current varies from approximately 170 microamperes to 50 microamperes as V1 and V2 vary from 1.0 volt to 3.5 volts, does not function as a constant current source for a wide range of common-mode input voltages (i.e. when V1=V2). Also, the source-drain currents ($I_{P1}$ and $I_{P2}$) in P1 and P2 vary as a function of the differential input voltages (V1 and V2) and the $V_{DS}$ across P3. Consequently, with $I_F$ constant throughout the range of operation the ratio of $I_F$ to $I_{P1}$ (or $I_{P2}$) changes. The resultant offset voltage ($\Delta V_F$) then changes significantly with changes in V1 and V2, over the operating range.

Applicant's invention resides, in part, in the recognition that the currents, $I_{P3}$, $I_{P1}$ and $I_{P2}$, vary as a function of the value of the differential input voltage levels, and that maintaining the offset current ($I_F$) constant causes the voltage offset ($\Delta V_F$) to vary significantly for different values of input voltages. Applicant then recognized that the offset current should be varied as a function of the differential input voltage to produce a relatively constant offset voltage over a large portion of the operating range.

Accordingly, circuits embodying the invention include means for producing an offset current which is responsive to at least one of the differential input signals for causing the offset current to vary in a fashion similar to that of the differential amplifier current and to maintain the offset voltage relatively constant over a large portion of the operating range.

Figure 2:
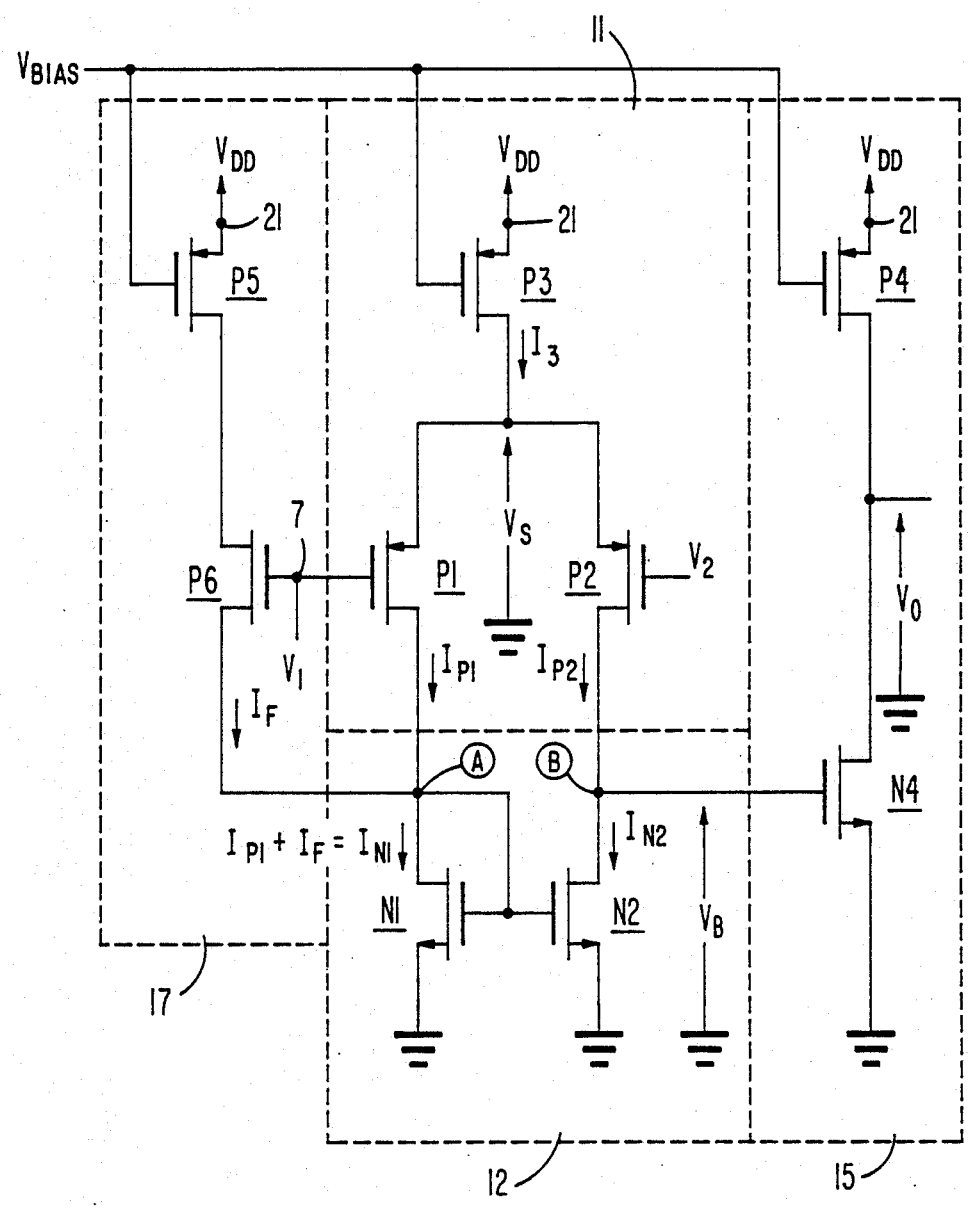

In the accompanying drawing like reference characters denote like components; and FIG. 1 is a schematic diagram of a prior art comparator circuit; and FIG. 2 is a schematic diagram of a comparator circuit embodying the invention.

The circuit of FIG. 2 differs from the prior art circuit of FIG. 1 in that the offset current generating network 17 includes an IGFET P6, whose conduction path is connected in series with the conduction path of IGFET P5 between power terminal 21 and node A, and whose gate electrode is connected in common with the gate electrode of P1 to an input terminal 7 to which is applied the differential input signal V1.

An examination of the circuit of FIG. 2 reveals that the structure of offset network 17 (i.e. P5 and P6) parallels the structure of the differential input stages IGFETs P1 and P3. IGFET P5 with its source connected to $V_{DD}$ and its gate electrode connected to $V_{BIAS}$ parallels the current source function and operation of P3. The geometry of P5 is proportional to that of P3 in order to pass a current $I_F$ via P5 which is proportional to the current passed by P3.

P6, connected in series with P5, is responsive to V1 applied to its gate electrode. IGFET P6 functions to modify the drain voltage of P5, and hence the source-drain potential ($V_{DS}$) of P5, in a similar manner to the way P1 responsive to V1 tends to modify the drain voltage of P3. Also, the current through P6 (and hence through P5) is modified as a function of V1 which tends to control its conductivity. This is similar to the function and operation of P1 in response to V1. This is particularly so when V1 and V2 have the same, or nearly, equal values. That is, when a common mode (differential) input voltage is applied to the gate electrodes of P1 and P2.

The operation of the circuit and the stability of the offset voltage ($\Delta V_F$) is of primary concern when V1 and V2 have the same, or nearly equal, values (i.e. at or near common-mode operation). The function of the comparator is to detect when V1 exceeds V2 by $\Delta V_F$. It is therefore critical that $\Delta V_F$ remain relatively constant over a wide range of operating and signal input conditions. Where the differential between V1 and V2 exceeds $\Delta V_F$ substantially, the stability of the offset voltage ($\Delta V_F$) is no longer critical.

The basic operation of the circuit of FIG. 2 is similar to that of FIG. 1 and need not be greatly detailed. As in FIG. 1, P3 is biased to provide a relatively constant current. However, as noted above, as the source-to-drain voltage ($V_{DS}$) of P3 changes, the current $I_{P3}$, passed by P3, changes. This is most significant when V1 and V2 are high and the $V_{DS}$ of P3 is less than 1 volt. Also, as in FIG. 1, P1 and P2 are responsive to the differential input voltages V1 and V2 applied to their gate electrodes with P1 producing a source-to-drain current $I_{P1}$ which flows into node A and P2 producing a source-to-drain current $I_{P2}$ which flows into node B. Typically, for V1 equal to V2, $I_{P1}$ is equal to $I_{P2}$.

The current generator 17 produces an offset current $I_F$ which also flows into node A when it is summed with $I_{P1}$. In the circuit of FIG, 2, $I_F$ is responsive to the value of V1 decreasing as V1 increases and increasing as V1 decreases.

The currents $I_F$ and $I_{P1}$ are summed in node A and produce a current $I_{N1}$ which flows via the source-drain path of N1 to ground. This current establishes the gate-to-source potential of N1 and N2. With N1 and N2 having similar geometries, N2 is thereby driven to conduct a current $I_{N2}$ which is equal to $I_{N1}$ which in turn is equal to $I_{P1}+I_F$. N2 with its drain-to-source path connected between node B and ground tends to draw (or sink) a current $I_{N2}$ out of node B. The switch point voltage ($V_{BSP}$) at node B is established when $I_{N2}$ is equal to the current $I_{P2}$ flowing via P2 into node B. When $I_{P2}$ is greater than $I_{N2}$, $V_B$ is greater than $V_{BSP}$. Transistor N4 is then turned-on hard and Vo is driven low. When $I_{P2}$ is less than $I_{N2}$, $V_B$ is less then $V_{BSP}$. Transistor N4 is then turned off and Vo is driven high towrds $V_{DD}$.

The offset current ($I_F$) causes the switching point voltage ($V_{BSP}$) to occur when V1 is equal to V2 plus $\Delta V_F$; where $\Delta V_F$ is the offset voltage or the differential between V1 and V2 which must be exceeded to cause the output to go from one state to another. For the circuit of FIG. 2, the switching point at node B occurs when V1 is equal to V2 plus $\Delta V_F$. Thus, the potential V1 applied to the gate of P1 must exceed the voltage V2 applied to the gate of P2 by $\Delta V_F$ to cause $V_B$ to be driven high and Vo to be driven low. For values of V1 which are less than V2+$\Delta V_F$, the voltage $V_B$ at node B is driven low and Vo is high.

With both IGFETs P6 and P1 controlled by V1, the offset current $I_F$ in P6 changes proportionately to the current $I_{P1}$ in P1. Maintaining the ratio of $I_F$ to $I_{P1}$ relatively constant over a wide range of operating potentials ensures that the voltage offset ($\Delta V_F$) between V1 and V2 necessary to achieve the switching point balance remains relatively constant over a large operating range. Thus, in the circuit of FIG. 2, $\Delta V_F$ is maintained relatively constant over a wide range of common-mode input voltages. This provides a consistent switching differential for values of V1 and V2 ranging between 1 and 4 volts for an operating potential ($V_{DD}$) of 5 volts.

As noted above, P5 and P6 parallel the structure of P3 and P1. Therefore, if these IGFETs are all formed at the same time, and if they are all processed in a similar manner, the processing variations will cancel. Also, the similarity and symmetry of the circuitry provides a high degree of inherent compensation to temperature variations since P5 and P6 will track the response of the differential input stage IGFETs P1 and P3.

The operation of the circuit of FIG. 2 was evaluated with $V_{DD}$ set at 5 volts and $V_{BIAS}$ set at 4 volts. Comparing the results with those noted above indicates that the offset voltage ($\Delta V_F$) in circuits embodying the invention is, in fact, relatively constant over a wide range of operation, as detailed below.

A. Near the low voltage end of the differential input range, V2 was set to 1 volt and V1 was driven to 1 volt plus a $\Delta V_F$ of 68 millivolts causing $I_{P1}$ to equal 80 microamperes, $I_{F1}$ to equal 10 microamperes and $I_{N1}$, $I_{N2}$ and $I_{P2}$ to each equal 90 microamperes.

B. Near the mid-range of the differential input range, V2 was set at 2.5 volts and V1 was driven to 2.5 volts plus a $\Delta V_F$ of 68 millivolts causing $I_{P1}$ to equal 71 microamperes, $I_F$ to equal 8.5 microamperes, and $I_{N1}$, $I_{N2}$ and $I_{P2}$ to each equal 79.5 microamperes.

C. Near the high end of the differential input range, V2 was set at 4 volts and V1 was driven to 4 volts plus a $\Delta V_F$ of 60 millivolts to cause $I_{P1}$ to equal 20 microamperes, $I_F$ to equal 2.5 microamperes, and $I_{N1}$, $I_{N2}$ and $I_{P2}$ to each equal 22.5 microamperes.

These results indicate that $\Delta V_F$ remained relatively constant as V1 and V2 were varied in tandem over a span ranging from 1 volt to 4 volts, which span, essentially, defines the useful range of the differential amplifier stage given an operating voltage of 5 volts. Further analysis also indicates that $\Delta V_F$ remained relatively constant by maintaining the ratio of $I_F$ to $I_{P1}$ relatively constant over the desired range.

What is claimed is:

1. The combination comprising:
   first and second power terminals for the application therebetween of an operating potential;
   first, second, third, fourth and fifth insulated-gate field-effect transistors (IGFETs), each IGFET having source and drain electrodes defining the ends of a conduction path and a control electrode;
   means connecting the conduction path of said first IGFET between said first power terminal and a first signal node;
   means connecting the conduction path of said second IGFET between said first signal node and a second signal node;
   means connecting the conduction paths of said third and fourth IGFETs in series between said first power terminal and said second signal node;
   means for applying a fixed bias voltage to the control electrodes of said first and third IGFETs;
   first and second signal input terminals for the application therebetween of a variable differential input signal;
   means connecting the control electrodes of said second and fourth IGFETs to said first signal input terminal for controlling the current level in said second and fourth IGFETs as a function of the voltage level at said signal input terminals;
   a third signal node for the production thereat of an output signal;
   means connecting the conduction path of said fifth IGFET between said first and third signal nodes;
   means connecting the control electrode of said fifth IGFET to said second signal input terminal; and
   a load means connected between said second and third signal nodes and said second power terminal.

2. The combination as claimed in claim 1 wherein said load means includes a current mirror means comprising:
   sixth and seventh IGFETs each one of said sixth and seventh IGFET having source and drain electrodes defining the ends of a conduction path and a control electrode;
   means connecting the conduction path of said sixth IGFET between said second signal node and said second power terminal;
   means connecting the conduction path of said seventh IGFET between said third signal node and said second power terminal; and
   means connecting said second signal node to the control electrodes of said sixth and seventh IGFETs.

3. The combination as claimed in claim 2 wherein said first, second, third, fourth and fifth IGFETs are of one conductivity type, and wherein said sixth and seventh IGFETs are of complementary conductivity type.

4. The combination comprising:
   first, second, third, fourth and fifth, insulated-gate field-effect transistors (IGFETs), each IGFET having source and drain electrodes defining the ends of a conduction path and a control electrode;
   a bias terminal for the application thereto of a fixed bias potential;
   first and second power terminals for the application therebetween of an operating potential;
   first and second signal input terminals for the application therebetween of variable differential input signals;
   means connecting the source-to-drain path of said first IGFET between said first power terminal and a first node;
   means connecting the source drain path of said second IGFET between said first node and a second node;
   means connecting the source-to-drain path of said third IGFET between said first node and a third node;
   means connecting the control electrode of said second IGFET to said first signal input terminal and means connecting the control electrode of said third IGFET to said second signal input terminal;
   means connecting the source-to-drain paths of said fourth and fifth IGFET in series between said first power terminal and said second node;
   means connecting the control electrodes of said first and fourth IGFETs to said bias terminal;
   means connecting the control electrode of said fifth IGFET to said first signal input terminal and its drain electrode to said second node; and
   current mirror means connected between said second and third nodes and said second power terminal tending to pass a like current between said third node and said second power terminal as flows between said second node and said second power terminal.

5. A comparator circuit comprising:
   a differential input stage comprising first and second insulated-gate field-effect transistors (IGFETs), each IGFET having source and drain electrodes defining the ends of a conduction path and a control electrode and said first and second IGFETs having their source electrodes connected in common to a first current source, their control electrodes connected to first and second signal input terminals, respectively, and their drains connected to first and second nodes, respectively, said first current source including a third IGFET having its source-to-drain path connected between a first point of operating potential and the source electrodes of said first and second IGFETs, and its gate electrode connected to a bias terminal;

means for applying variable differential signals to said first and second signal input terminals and to the control electrodes of said first and second IGFETs;

a current mirror connected between said first and second node for passing all the current flowing in said first node and tending to pass the same current in said second node; and an offset current generator connected to said first node comprising: (a) a second current source for passing a current proportional to the current produced by said first current source; and (b) input signal responsive means serially connected between said second current source and said first node for maintaining the current flowing from said second current source into said first node proportional to the current in said first IGFET, said second current source including a fourth IGFET and said input signal responsive means includes a fifth IGFET, wherein the conduction paths of said fourth and fifth IGFETs are connected in series between said first point of operating potential and said first node; and wherein the gate electrode of said fourth IGFET is connected to said bias terminal, and wherein the gate electrode of said fifth IGFET is connected to said first signal input terminal.

* * * * *